US012787326B2

(12) United States Patent
Lin et al.

(10) Patent No.: US 12,787,326 B2
(45) Date of Patent: Nov. 3, 2026

(54) CELL STRUCTURE OF SEMICONDUCTOR DEVICE, PREPARATION METHOD THEREOF AND SEMICONDUCTOR DEVICE

(71) Applicants: GREE ELECTRIC APPLIANCES, INC. OF ZHUHAI, Zhuhai (CN); EDGELESS SEMICONDUCTOR CO., LTD. OF ZHUHAI, Zhuhai (CN)

(72) Inventors: Yiren Lin, Zhuhai (CN); Bo Shi, Zhuhai (CN); Ting Xiao, Zhuhai (CN)

(73) Assignees: GREE ELECTRIC APPLICANCES, INC. OF ZHUHAI, Zhuhai (CN); EDGELESS SEMICONDUCTOR CO., LTD. OF ZHUHAI, Zhuhai (CN)

( * ) Notice: Subject to any disclaimer, the term of this patent is extended or adjusted under 35 U.S.C. 154(b) by 537 days.

(21) Appl. No.: 18/472,136

(22) Filed: Sep. 21, 2023

(65) Prior Publication Data

US 2024/0014301 A1 Jan. 11, 2024

Related U.S. Application Data

(63) Continuation of application No. PCT/CN2021/141280, filed on Dec. 24, 2021.

(30) Foreign Application Priority Data

May 26, 2021 (CN) ......................... 202121152384.0

(51) Int. Cl.
*H10D 12/00* (2025.01)
*H10D 12/01* (2025.01)
(Continued)

(52) U.S. Cl.
CPC ......... *H10D 12/481* (2025.01); *H10D 12/038* (2025.01); *H10D 62/106* (2025.01); *H10D 62/126* (2025.01); *H10D 64/117* (2025.01)

(58) Field of Classification Search
CPC ............... H10D 12/481; H10D 12/038; H10D 62/126–127; H10D 64/117; H10D 62/106–107
See application file for complete search history.

(56) References Cited

U.S. PATENT DOCUMENTS

2015/0144995 A1 5/2015 Takahashi

FOREIGN PATENT DOCUMENTS

CN 105745758 A 7/2016
CN 107180863 A 9/2017
(Continued)

OTHER PUBLICATIONS

International Search Report issued in corresponding PCT Application No. PCT/CN2021/141280, dated Mar. 9, 2022.

*Primary Examiner* — Amar Movva
(74) *Attorney, Agent, or Firm* — Westbridge IP LLC

(57) ABSTRACT

Disclosed are a cell structure of a semiconductor device, a preparation method thereof and a semiconductor device. The cell structure includes: a substrate of a first conductive type; at least one first trench gate, at least one second trench gate, at least one third trench gate, and at least one fourth trench gate that are sequentially disposed side by side in an upper surface of the substrate; a source region of the first conductive type located in an upper surface of the well region and disposed on two sides of each trench gate; and an emitter metal layer located above the substrate and electrically connected to the source region, where the first trench gate, the second trench gate, and the third trench gate are isolated from the emitter metal layer by a first interlayer dielectric layer, and the fourth trench gate is electrically connected to the emitter metal layer.

20 Claims, 8 Drawing Sheets

(51) Int. Cl.

| | |
|---|---|
| ***H10D 62/10*** | (2025.01) |
| ***H10D 64/00*** | (2025.01) |

(56) References Cited

FOREIGN PATENT DOCUMENTS

| | | | |
|---|---|---|---|
| CN | 107275396 | A | 10/2017 |
| CN | 109713037 | A | 5/2019 |
| CN | 110649090 | A | 1/2020 |
| CN | 110890422 | A | 3/2020 |
| CN | 111211168 | A | 5/2020 |
| CN | 214848639 | U | 11/2021 |

CELL STRUCTURE OF SEMICONDUCTOR DEVICE, PREPARATION METHOD THEREOF AND SEMICONDUCTOR DEVICE

CROSS-REFERENCE TO RELATED APPLICATIONS

The present application is a continuation application of International Application No. PCT/CN2021/141280, filed on Dec. 24, 2021, which claims priority to Chinese Patent Application No. 202121152384.0, filed on May 26, 2021. Both applications are incorporated herein by reference in their entireties.

TECHNICAL FIELD

The present disclosure relates to the field of semiconductor device technologies, and in particular, to a cell structure of a semiconductor device, a preparation method of a cell structure of a semiconductor device and a semiconductor device.

BACKGROUND

An Insulated Gate Bipolar Transistor (IGBT), as a core semiconductor device of weak current control of strong current, is widely used in industrial fields such as industry, 4C (Communication, Computer, Consumer electronics, Car electronics), and home appliances. An IGBT device has dozens of parameters. Therefore, a design difficulty of the IGBT is also balance between the parameters. For example, a reverse withstand voltage and a forward conduction voltage drop are a pair of compromise parameters. If a Breakdown Voltage (BV) increases, a saturation voltage drop (Vcesat, the smaller the Vcesat is, the better an effect is) increases. For example, if the Vcesat decreases, a turn-off time increases. There is also a compromise between a saturation current, a conduction voltage drop, and a short circuit tolerance. Generally, if the saturation current increases, the Vcesat decreases, and the short circuit tolerance decreases. Therefore, it is especially important to design the parameters reasonably.

At present, mainstream structures of IGBT include field stop type IGBTs, which are specifically divided into an IGBT of a planar gate field stop type (including an N-type drift region, a Pbody base region, an N+ source region, a planar gate, an interlayer dielectric layer, an emitter, an N-type field stop layer FS, a P+ collector region and a collector) as shown in FIG. 1 and an IGBT of a trench gate field stop type (including an N-type drift region, a Pbody base region, an N+ source region, a trench gate, an interlayer dielectric layer, an emitter, an N-type field stop layer FS, a P+ collector region and a collector) as shown in FIG. 2. The most mainstream structure of IGBT at present is the trench gate field stop type, compared with a planar gate IGBT, a cell size of a trench gate IGBT is decreased, and a current density of the trench gate IGBT is increased. However, an increase of the current density leads to a decrease of a short circuit time, that is, a Short Circuit Safe Operating Area (SCSOA) is decreased, resulting in that the trench gate IGBT fails to achieve a compromise balance between three parameters of the saturation current, the Vcesat, and the short circuit tolerance.

SUMMARY

In response to the above problem, the present disclosure provides a cell structure of a semiconductor device and a semiconductor device, which solves a technical problem that the trench gate IGBT fails to achieve a compromise balance between three parameters of the saturation current, the Vcesat, and the short circuit tolerance in related technologies.

In a first aspect, the present disclosure provides a cell structure of a semiconductor device, which includes:

- a substrate of a first conductive type;
- at least one first trench gate, at least one second trench gate, at least one third trench gate, and at least one fourth trench gate that are sequentially disposed side by side in an upper surface of the substrate;
- a well region of a second conductive type located in the upper surface of the substrate and disposed between any two adjacent trench gates;
- a source region of the first conductive type located in an upper surface of the well region and disposed on two sides of each of the first trench gate, the third trench gate, and the fourth trench gate, where the first trench gate, the third trench gate, and the fourth trench gate are respectively in contact with source regions on two sides of the first trench gate, the third trench gate, and the fourth trench gate; and
- an emitter metal layer located above the substrate and electrically connected to the source region,
- where the first trench gate, the second trench gate, and the third trench gate are isolated from the emitter metal layer by a first interlayer dielectric layer, and the fourth trench gate is electrically connected to the emitter metal layer.

According to embodiments of the present disclosure, in some implementations, the first trench gate, the second trench gate, and the third trench gate are connected to an external gate driving circuit.

According to embodiments of the present disclosure, in some implementations, a depth of any one of the first trench gate, the second trench gate, the third trench gate, and the fourth trench gate is greater than a depth of the well region.

According to embodiments of the present disclosure, in some implementations, the cell structure further includes:

- a second interlayer dielectric layer located above the fourth trench gate,
- where the second interlayer dielectric layer includes a contact hole that passes through the second interlayer dielectric layer, and the emitter metal layer is electrically connected to the fourth trench gate by a conductive material filled in the contact hole.

According to embodiments of the present disclosure, in some implementations, the first trench gate includes a first gate trench located in the upper surface of the substrate, a first gate disposed in the first gate trench, and a first gate insulating layer disposed between the first gate trench and the first gate.

According to embodiments of the present disclosure, in some implementations, the second trench gate includes a second gate trench located in the upper surface of the substrate, a second gate disposed in the second gate trench, and a second gate insulating layer disposed between the second gate trench and the second gate.

According to embodiments of the present disclosure, in some implementations, the third trench gate includes a third gate trench located in the upper surface of the substrate, a third gate disposed in the third gate trench, and a third gate insulating layer disposed between the third gate trench and the third gate.

According to embodiments of the present disclosure, in some implementations, the fourth trench gate includes a fourth gate trench located in the upper surface of the substrate, a fourth gate disposed in the fourth gate trench, and a fourth gate insulating layer disposed between the fourth gate trench and the fourth gate.

According to embodiments of the present disclosure, in some implementations, the cell structure further includes:

- a field stop layer of the first conductive type located below the substrate;
- a collector region of the second conductive type located below the field stop layer; and
- a collector metal layer located below the collector region and electrically connected to the collector region.

In a second aspect, the present disclosure provides a semiconductor device, which includes one or more of the cell structures of the semiconductor device according to any one of the first aspect.

By using the above technical solutions, at least the following technical effects may be achieved.

The present disclosure provides a cell structure of a semiconductor device and a semiconductor device, the cell structure of the semiconductor device includes: a substrate of a first conductive type; at least one first trench gate, at least one second trench gate, at least one third trench gate, and at least one fourth trench gate that are sequentially disposed side by side in an upper surface of the substrate; a well region of a second conductive type located in the upper surface of the substrate and disposed between any two adjacent trench gates; a source region of the first conductive type located in an upper surface of the well region and disposed on two sides of each of the first trench gate, the third trench gate, and the fourth trench gate; and an emitter metal layer located above the substrate and electrically connected to the source region, where the first trench gate, the second trench gate, and the third trench gate are isolated from the emitter metal layer by a first interlayer dielectric layer, and the fourth trench gate is electrically connected to the emitter metal layer. This cell structure may achieve a better compromise balance between three parameters of a conduction voltage drop, a saturation current, and a short circuit time, and may also improve an anti-dv/dt capability of a device.

BRIEF DESCRIPTION OF THE DRAWINGS

The drawings are intended to provide further understanding of the present disclosure and form a part of the specification, and they are used to interpret the present disclosure together with the specific embodiments below, but do not constitute a limitation on the present disclosure.

DETAILED DESCRIPTIONS OF THE EMBODIMENTS

Figure 1:
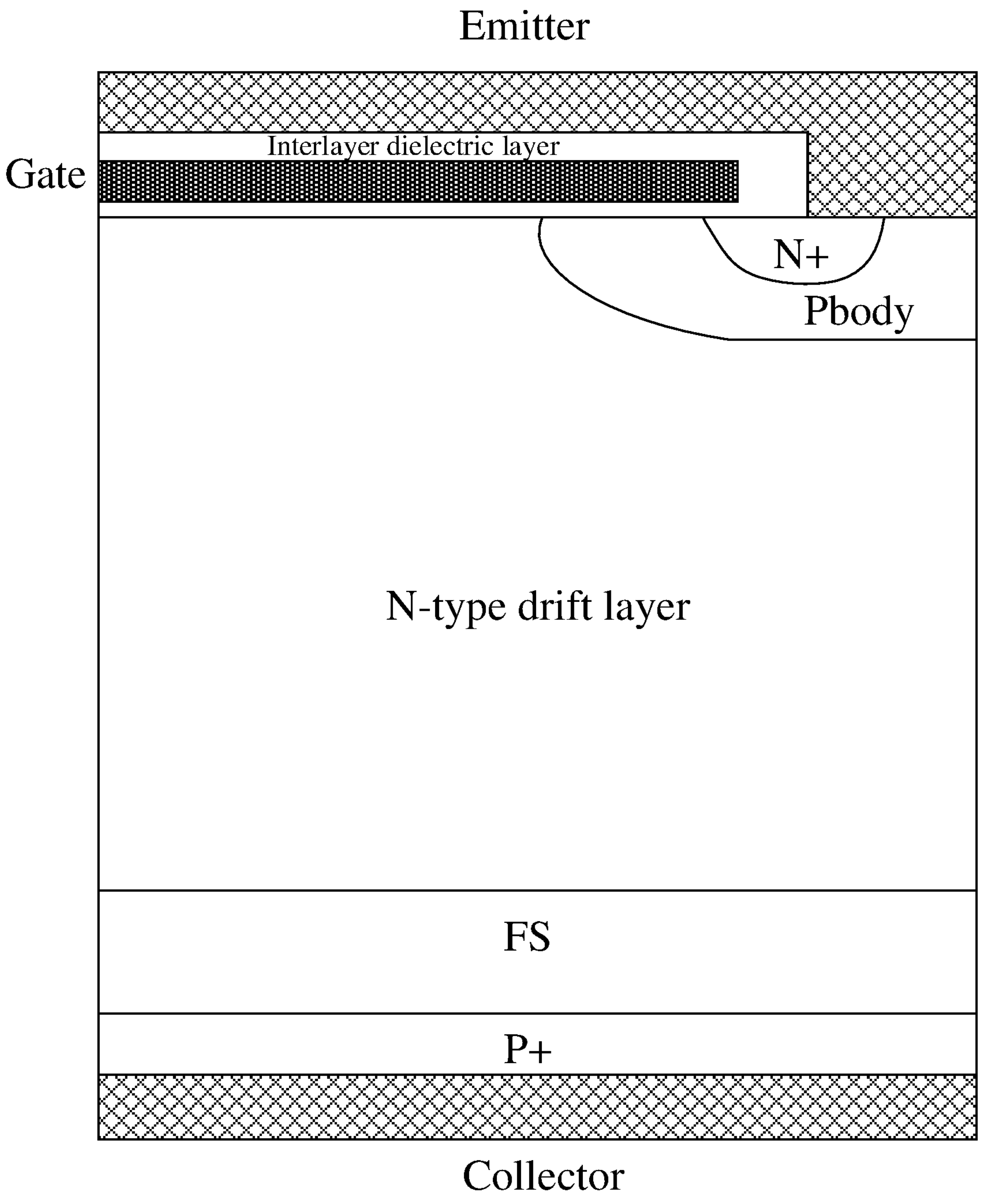
FIG. 1 (Prior Art)
FIG. 1 is a schematic diagram of a cross-sectional structure of a cell structure of a conventional planar gate stop type IGBT.
Figure 2:
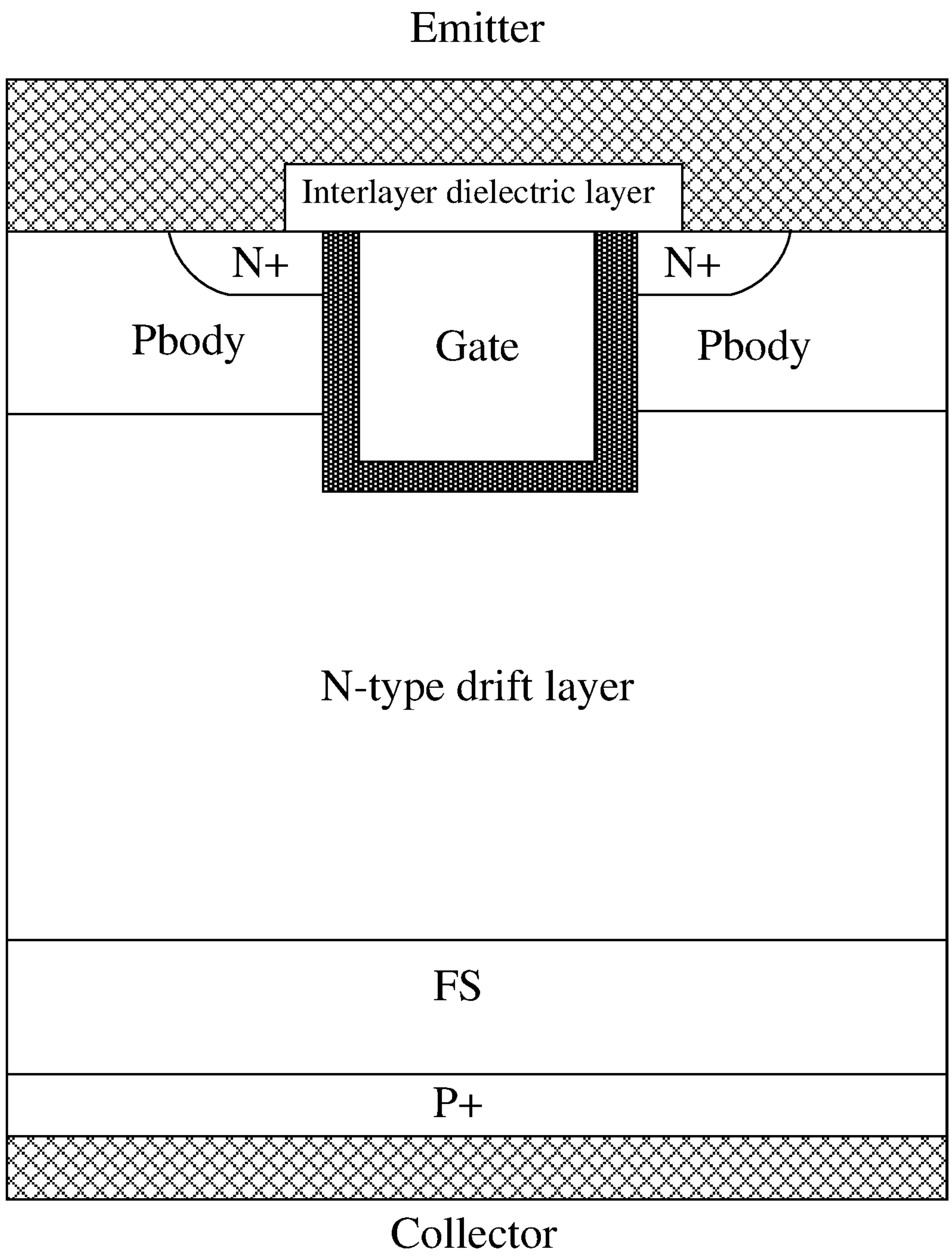
FIG. 2 (Prior Art)
FIG. 2 is a schematic diagram of a cross-sectional structure of a cell structure of a conventional trench gate stop type IGBT.

The implementations of the present disclosure are described in detail below with reference to the accompanying drawings and embodiments. In this way, a realization process of how to apply technical means to solve technical problems and achieve corresponding technical effects can be fully understood and implemented accordingly. The embodiments of the present disclosure and features in the embodiments may be combined with each other without conflict, and technical solutions formed are all within a protection scope of the present disclosure. In the accompanying drawings, for clarity, dimensions and relative dimensions of a layer and a region may be exaggerated. Same reference numerals represent same elements from the beginning to the end.

It should be understood that although terms such as "first", "second", and "third" may be used to describe various elements, components, regions, layers and/or parts, the elements, the components, the regions, the layers and/or the parts shall not be limited by the terms. The terms are used merely to distinguish one element, one component, one region, one layer or one part from another element, another component, another region, another layer or another part. Therefore, without departing from teachings of the present disclosure, a first element, a first component, a first region, a first layer or a first part discussed below may be represented as a second element, a second component, a second region, a second layer or a second part.

It should be understood that spatial relationship terms such as "above", "located . . . above", "below", "located . . . below" may be used herein for convenience of description to describe a relationship between an element or a feature shown in a figure and another element or another feature. It should be understood that, in addition to orientations shown in a figure, the spatial relationship terms intend to further include different orientations of a device in use and operation. For example, if a device in a figure is flipped, then elements or features described as "below other elements" will be oriented "above" other elements or features. Thus, the exemplary terms "below" and "at . . . lower" may include two orientations: upper and lower. The device may be otherwise oriented (rotated by 90 degrees or other orientations) and a spatial descriptors used herein are interpreted accordingly.

The terms used herein are intended merely to describe specific embodiments and are not intended to be a limitation of the present disclosure. As used herein, singular forms "a", "an" and "the/said" are also intended to include plural forms, unless the context clearly indicates another manner. It should also be understood that the terms such as "constitute" and/or "include", when used in the specification, determine presence of features, integers, steps, operations, elements and/or components, but do not preclude the presence or addition of one or more other features, integers, steps, operations, elements, components and/or groups. AS used herein, the term "and/or" includes any and all combinations of associated listed items.

The embodiments of the present disclosure are described herein with reference to a cross-sectional view of a schematic diagram of an ideal embodiment (and an intermediate structure) of the present disclosure. Thus, variations from a shown shape due to, for example, preparation techniques and/or tolerances may be expected. Therefore, the embodiments of the present disclosure should not be limited to specific shapes of regions shown herein, but rather include shape deviations due to, for example, preparation. For example, an injection region shown as a rectangle typically has a circular or curved feature and/or an injection concentration gradient at its edge, rather than a binary change from the injection region to a non-injection region. Similarly, a buried region formed by injection may cause some injection into a region between the buried region and a surface through which the injection is performed. Therefore, regions shown in figures are essentially schematic, and shapes of the regions are not intended to show actual shapes of regions of the device, and are not intended to limit a scope of the present disclosure.

For a thorough understanding of the present disclosure, detailed structures and steps will be proposed in the following description in order to illustrate the technical solutions proposed in the present disclosure. Preferred embodiments of the present disclosure are described in detail below, however, in addition to these detailed descriptions, the present disclosure may have other embodiments.

Figure 3:
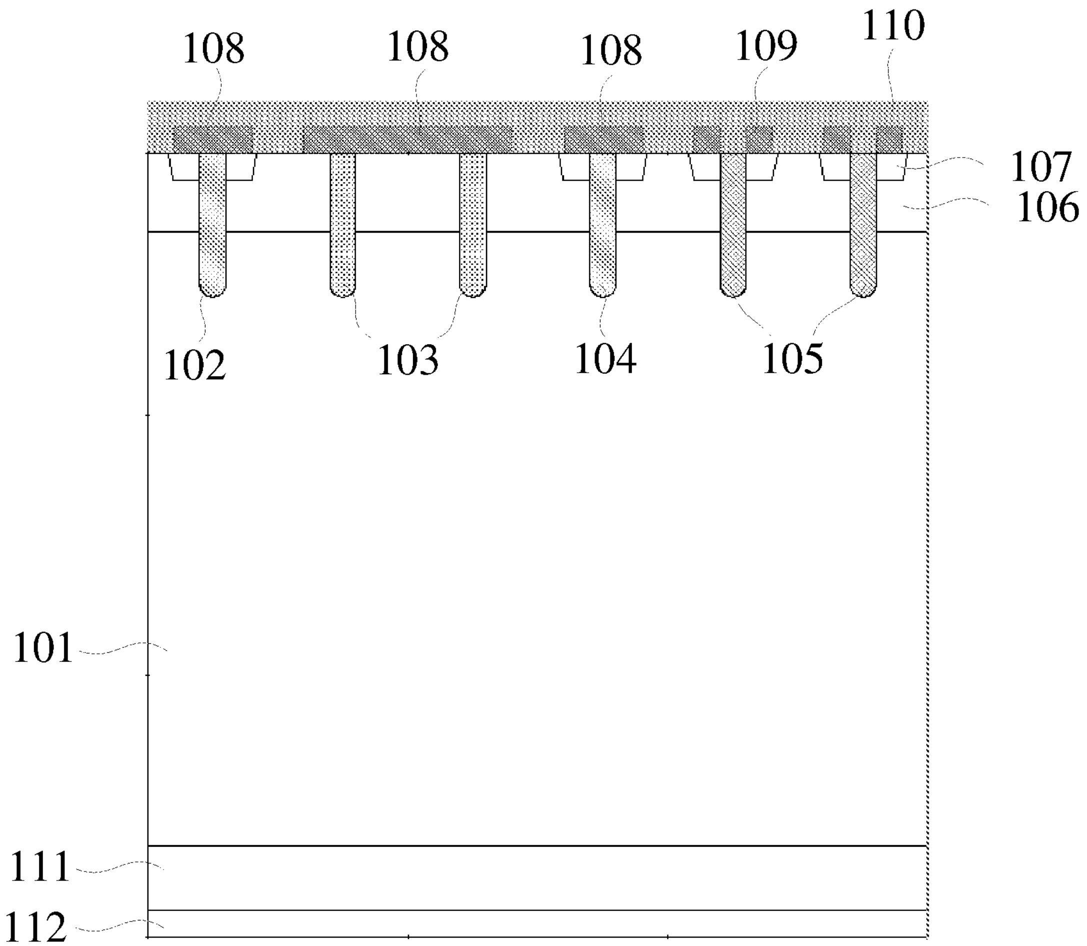
FIG. 3 is a schematic diagram of a cross-sectional structure of a cell structure of a semiconductor device according to an exemplary embodiment of the present disclosure.
Figure 4:
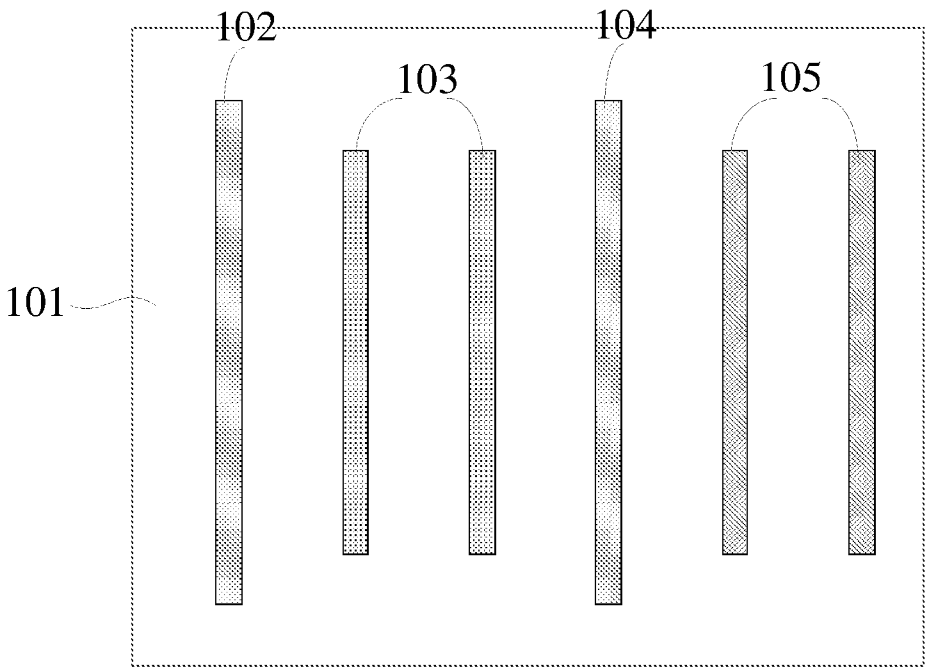
FIG. 4 is a frontal top view of a cell structure of a semiconductor device according to an exemplary embodiment of the present disclosure.

As shown in FIG. 3 and FIG. 4, embodiments of the present disclosure provide a cell structure of a semiconductor device, which includes a substrate 101, at least one first trench gate 102, at least one second trench gate 103, at least one third trench gate 104, at least one fourth trench gate 105, a well region 106, a source region 107, a first interlayer dielectric layer 108, a second interlayer dielectric layer 109, an emitter metal layer 110, a field stop layer 111, a collector region 112, and a collector metal layer (not shown in figures).

It should be noted that, in order to clearly show in FIG. 4 shapes and positions of the first trench gate 102, the second trench gate 103, the third trench gate 104, and the fourth trench gate 105, the well region 106, the source region 107, the first interlayer dielectric layer 108, the second interlayer dielectric layer 109, the emitter metal layer 110, the field stop layer 111, the collector region 112, and the collector metal layer are not shown in FIG. 4. However, in conjunction with FIG. 3, shapes and positions of the well region 106, the source region 107, the first interlayer dielectric layer 108, the second interlayer dielectric layer 109, the emitter metal layer 110, the field stop layer 111, the collector region 112, and the collector metal layer may be understood.

For example, the substrate 101 is a substrate of a first conductive type, and the substrate 101 may be an epitaxially grown drift layer.

At least one first trench gate 102, at least one second trench gate 103, at least one third trench gate 104, and at least one fourth trench gate 105 are sequentially disposed side by side in an upper surface of the substrate 101.

The first trench gate 102, the second trench gate 103, the third trench gate 104, and the fourth trench gate 105 extend in a same direction.

The first trench gate 102 includes a first gate trench (not shown in figures) located in the upper surface of the substrate 101, a first gate (not shown in figures) disposed in the first gate trench, and a first gate insulating layer (not shown in figures) disposed between the first gate trench and the first gate. The first gate insulating layer isolates the first gate from the substrate 101.

The second trench gate 103 includes a second gate trench (not shown in figures) located in the upper surface of the substrate 101, a second gate (not shown in figures) disposed in the second gate trench, and a second gate insulating layer (not shown in figures) disposed between the second gate trench and the second gate. The second gate insulating layer isolates the second gate from the substrate 101.

The third trench gate 104 includes a third gate trench (not shown in figures) located in the upper surface of the substrate 101, a third gate (not shown in figures) disposed in the third gate trench, and a third gate insulating layer (not shown in figures) disposed between the third gate trench and the third gate. The third gate insulating layer isolates the third gate from the substrate 101.

The fourth trench gate 105 includes a fourth gate trench (not shown in figures) located in the upper surface of the substrate 101, a fourth gate (not shown in figures) disposed in the fourth gate trench, and a fourth gate insulating layer (not shown in figures) disposed between the fourth gate trench and the fourth gate. The fourth gate insulating layer isolates the fourth gate from the substrate 101.

The well region 106 is a well region of a second conductive type, and the well region 106 is located between any two adjacent trench gates. A depth of any one of the first trench gate 102, the second trench gate 103, the third trench gate 104, and the fourth trench gate 105 is greater than a depth of the well region 106. An upper surface of the well region 106 is flush with the upper surface of the substrate 101. Each trench gate is in contact with the well regions 106 on two sides of the trench gate. A junction depth of the well region 106 may be 2.5 um.

The source region 107 is a source region of the first conductive type. The source region 107 is disposed in the surface of the well region 106, and is disposed on two sides of each of the first trench gate 102, the third trench gate 104, and the fourth trench gate 105. The first trench gate 102 is in contact with the source regions 107 on two sides of the first trench gate 102, the third trench gate 104 is in contact with the source regions 107 on two sides of the third trench gate 104, and the fourth trench gate 105 is in contact with the source regions 107 on two sides of the fourth trench gate 105. An upper surface of the source region 107 is flush with the upper surface of the well region 106. A junction depth of the source region 107 is smaller than the junction depth of the well region 106, and the junction depth of the source region 107 may be 0.8 um.

The first interlayer dielectric layer 108 is disposed above the first trench gate 102, the second trench gate 103, and the third trench gate 104, and covers upper surfaces of the first trench gate 102, the second trench gate 103, and the third trench gate 104, so that the first trench gate 102, the second trench gate 103 and the third trench gate 104 are isolated from the emitter metal layer 110.

The second interlayer dielectric layer 109 is disposed above the fourth trench gate 105, and the second interlayer dielectric layer 109 includes a contact hole (not shown in figures) that passes through the second interlayer dielectric layer 109. The contact hole is filled with a conductive material, and the conductive material may be the same as a material of the emitter metal layer 110.

The first interlayer dielectric layer 108 may be the same material as the second interlayer dielectric layer 109, the material may be a Boro-Phospho-Silicate Glass (BPSG), and a thickness of the material is 1 um.

The emitter metal layer 110 is located above the substrate 101 and covers the upper surface of the source region 107. The emitter metal layer 110 is electrically connected to the source region 107, and electrically connected to the fourth trench gate 105 by a conductive material filled in the contact hole.

The first trench gate 102, the second trench gate 103, and the third trench gate 104 are connected to an external gate driving circuit.

It should be seen that the first trench gate 102 and the third trench gate 104 are both connected to the external gate driving circuit, and are respectively in contact with the source regions 107 on both sides of the first trench gate 102 and the third trench gate 104, so that the first trench gate 102 and the third trench gate 104 are both true gates. After applying a voltage to the first trench gate 102, the third trench gate 104, and an emitter, an inversion channel is first formed in the well region 106, and then the source regions 107 on two sides of the first trench gate 102 and the third trench gate 104 may realize a path of electronics, in an inversion electron channel, from the emitter to a collector to form a conduction current.

Although the second trench gate 103 is connected to the external gate driving circuit, two sides of the second trench gate 103 are not provided with the source region 107, so that the second trench gate 103 is a virtual gate. After applying a voltage to the second trench gate 103 and the emitter, an inversion channel (carrier accumulation) is first formed in the well region 106, but due to the absence of the source region 107, an inversion electron channel is failed to be formed, and a conduction current is failed to be formed. However, after the second trench gate 103 and the emitter are applied with a voltage, presence of an inversion electron may attract a hole of the collector to move upward at a uniform velocity, which is conducive to hole current transport, so that Vcesat may be reduced, and a conduction loss may be reduced.

Although the fourth trench gate 105 is in contact with the source regions 107 on two sides of the fourth trench gate 105, the fourth trench gate 105 is electrically connected to the emitter metal layer 110, and is not connected to an external gate control circuit, so that gate control is failed to be realized. Neither is an inversion electron formed in the well region 106, nor is a path of electronics realized, and a conductive channel is failed to be formed, thus reducing a saturation current, and improving a short circuit time Tsc.

The true gate and the virtual gate are alternately disposed, the first trench gate 102 and the third trench gate 104 are separated by at least one second trench gate 103, and the second trench gate 103 and the fourth trench gate 105 are separated by at least one third trench gate 104.

Quantities of the first trench gate 102, the second trench gate 103, the third trench gate 104, and the fourth trench gate 105 are related to a size of the cell structure, the quantities of the first trench gate 102, the second trench gate 103, the third trench gate 104, and the fourth trench gate 105 are selected to achieve a compromise balance between the saturation current, the Vcesat, and the short circuit tolerance.

Moreover, the true gates are separated by virtual gates, which may avoid an excessive current density and improve an anti-dv/dt capability of the device.

For example, as shown in FIG. 3, a quantity of the first trench gate 102 may be 1, a quantity of the second trench gate 103 may be 2, a quantity of the third trench gate 104 may be 1, and a quantity of the fourth trench gate 105 may be 2.

The field stop layer 111 is a field stop layer of the first conductive type, and the field stop layer 111 is located below the substrate 101.

The collector region 112 is a collector region of the second conductive type, and the collector region 112 is located below the field stop layer 111.

The collector metal layer is located below the collector region 112 and electrically connected to the collector region 112.

In the present embodiments, the first conductive type and the second conductive type are opposite. For example, when the first conductive type is N-type, the second conductive type is P-type; and when the first conductive type is P-type, the second conductive type is N-type. Specifically, a reasonable selection may be made according to a type of a device actually required to be prepared.

The cell structure of the semiconductor device is a cell structure of IGBT.

The present embodiments provide a cell structure of a semiconductor device, which includes: a substrate 101 of a first conductive type; at least one first trench gate 102, at least one second trench gate 103, at least one third trench gate 104, and at least one fourth trench gate 105 that are sequentially disposed side by side in an upper surface of the substrate 101; a well region 106 of a second conductive type located in the upper surface of the substrate 101 and disposed between any two adjacent trench gates; a source region 107 of the first conductive type located in an upper surface of the well region 106 and disposed on two sides of each of the first trench gate 102, the third trench gate 104, and the fourth trench gate 105; and an emitter metal layer 110 located above the substrate 101 and electrically connected to the source region 107, where the first trench gate 102, the second trench gate 103, and the third trench gate 104 are isolated from the emitter metal layer 110 by a first interlayer dielectric layer 108, and the fourth trench gate 105 is electrically connected to the emitter metal layer 110. This cell structure may achieve a better compromise balance between three parameters of the conduction voltage drop, the saturation current, and the short circuit time, and may also improve the anti-dv/dt capability of the device.

Figure 5:
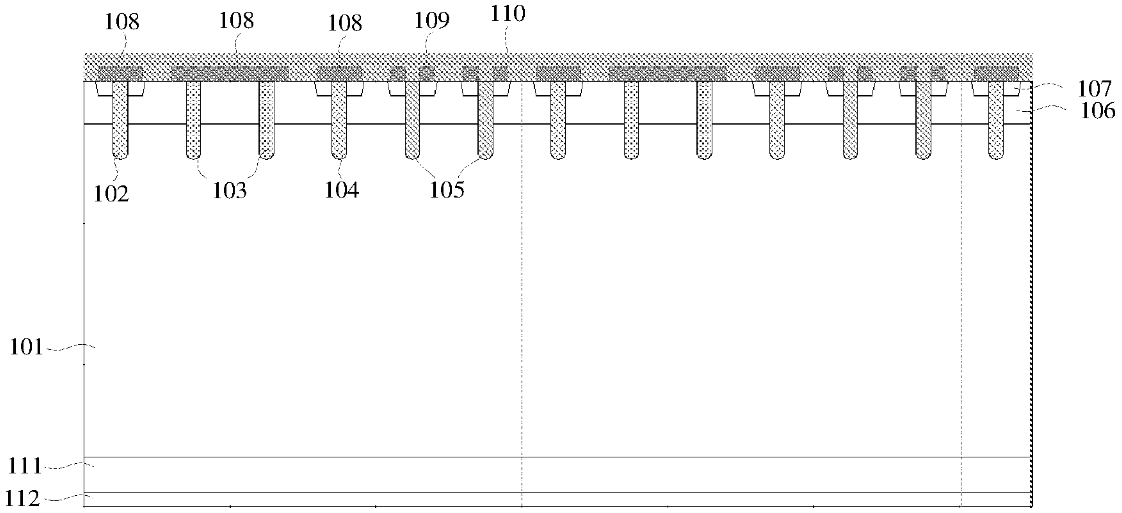
FIG. 5 is a schematic diagram of a cross-sectional structure of a semiconductor device according to an exemplary embodiment of the present disclosure.

On a basis of the above embodiments, the present embodiment provides a semiconductor device, which includes one and more cell structures as in any one of the above embodiments, and the structure of which is shown in FIG. 5.

Figure 6:
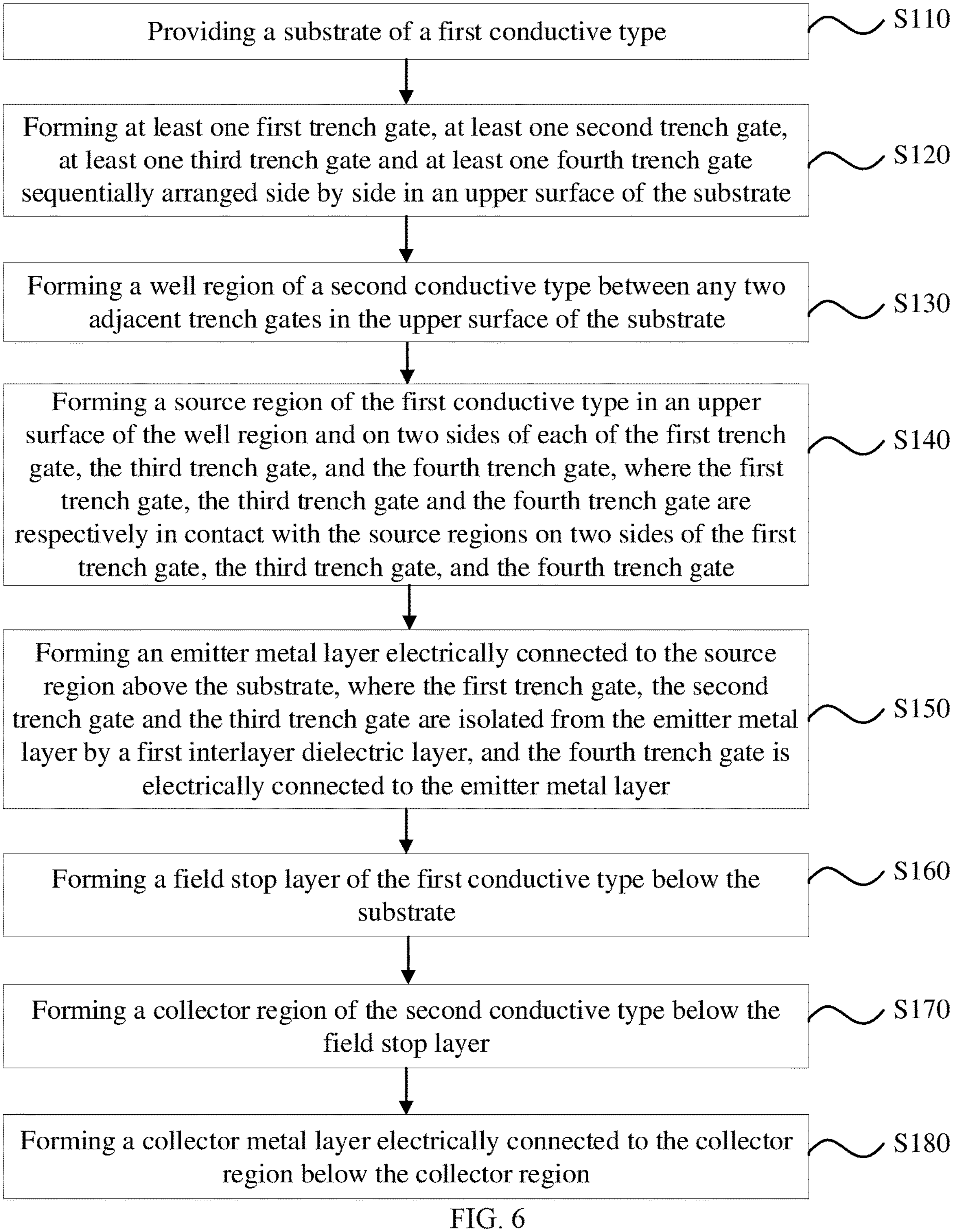
FIG. 6 is a schematic flowchart of a preparation method of a cell structure of a semiconductor device according to an exemplary embodiment of the present disclosure.
Figure 7:
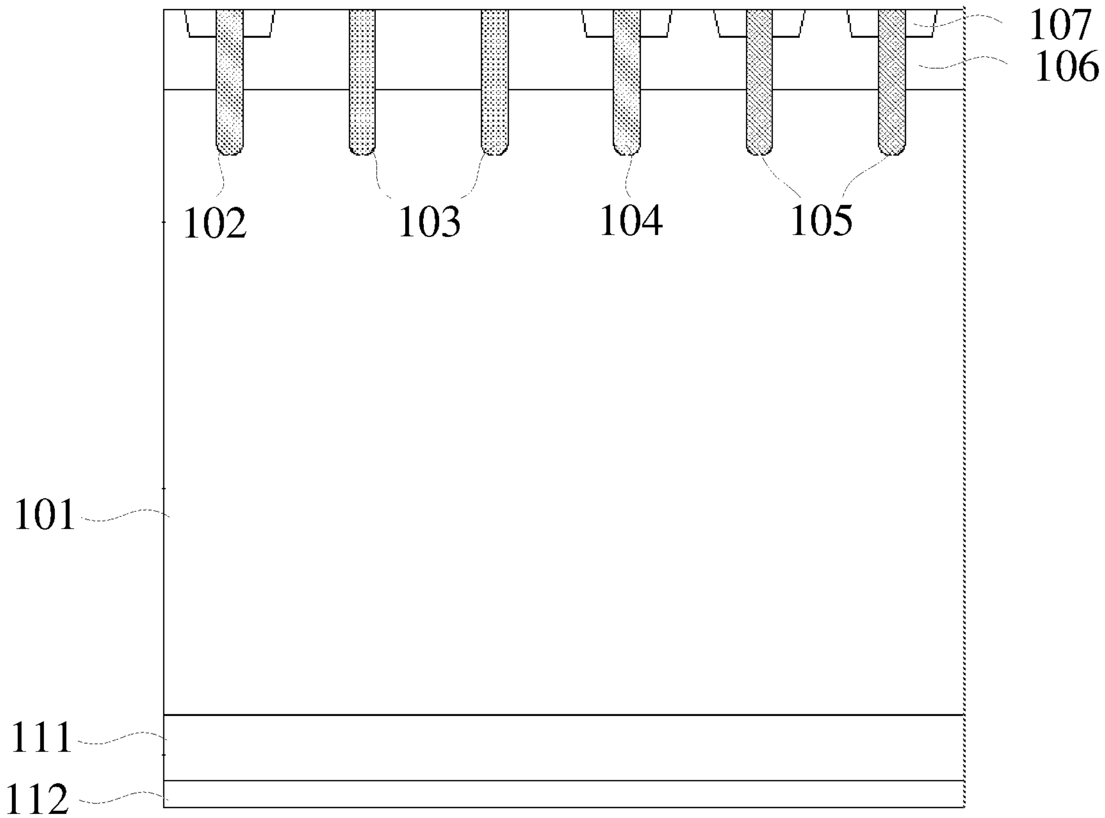
FIG. 7 is a schematic diagram of a cross-sectional structure of a first intermediate structure formed by a relevant step of a preparation method of a cell structure of a semiconductor device according to an exemplary embodiment of the present disclosure.
Figure 8:
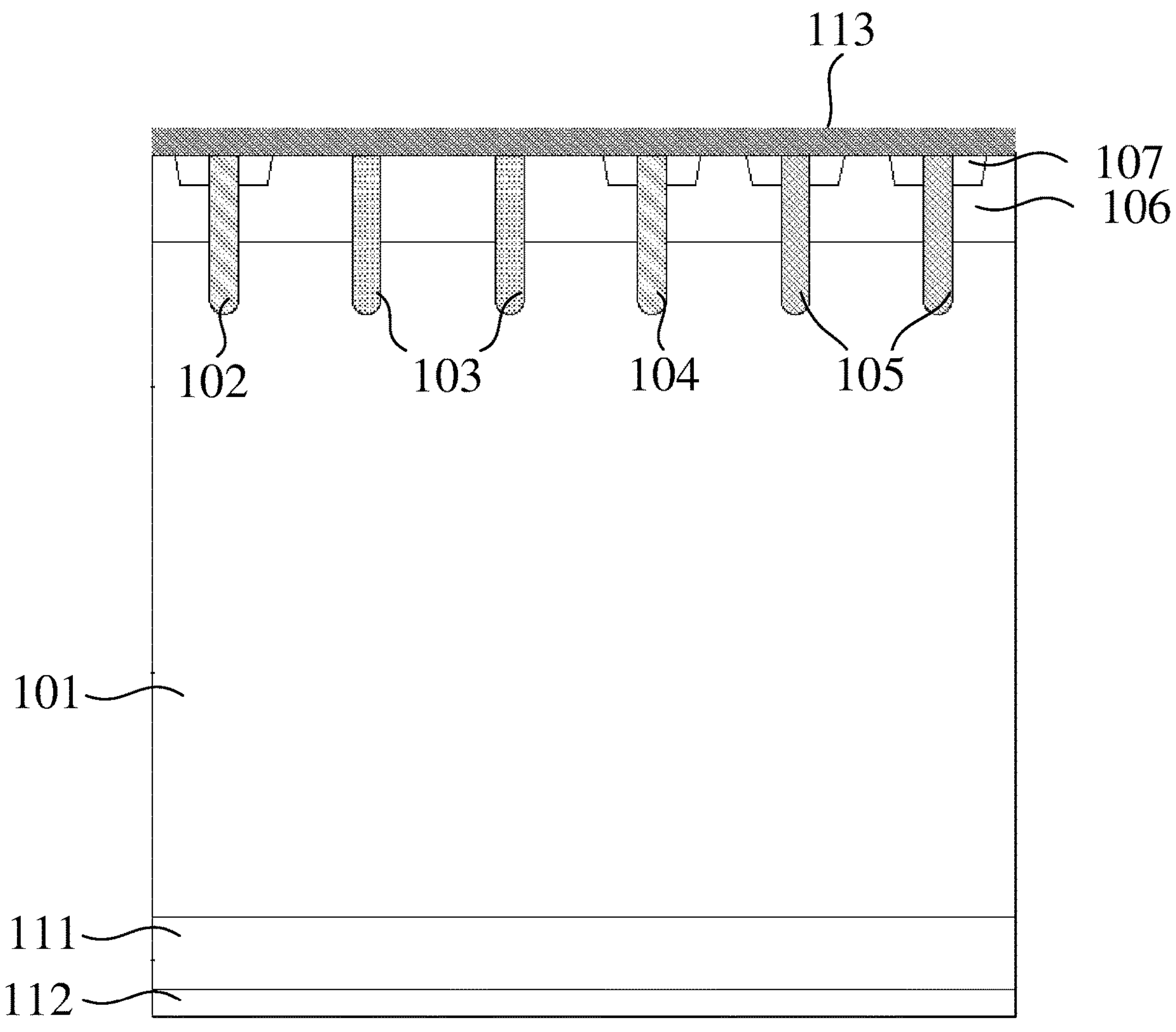
FIG. 8 is a schematic diagram of a cross-sectional structure of a second intermediate structure formed by a relevant step of a preparation method of a cell structure of a semiconductor device according to an exemplary embodiment of the present disclosure.
Figure 9:
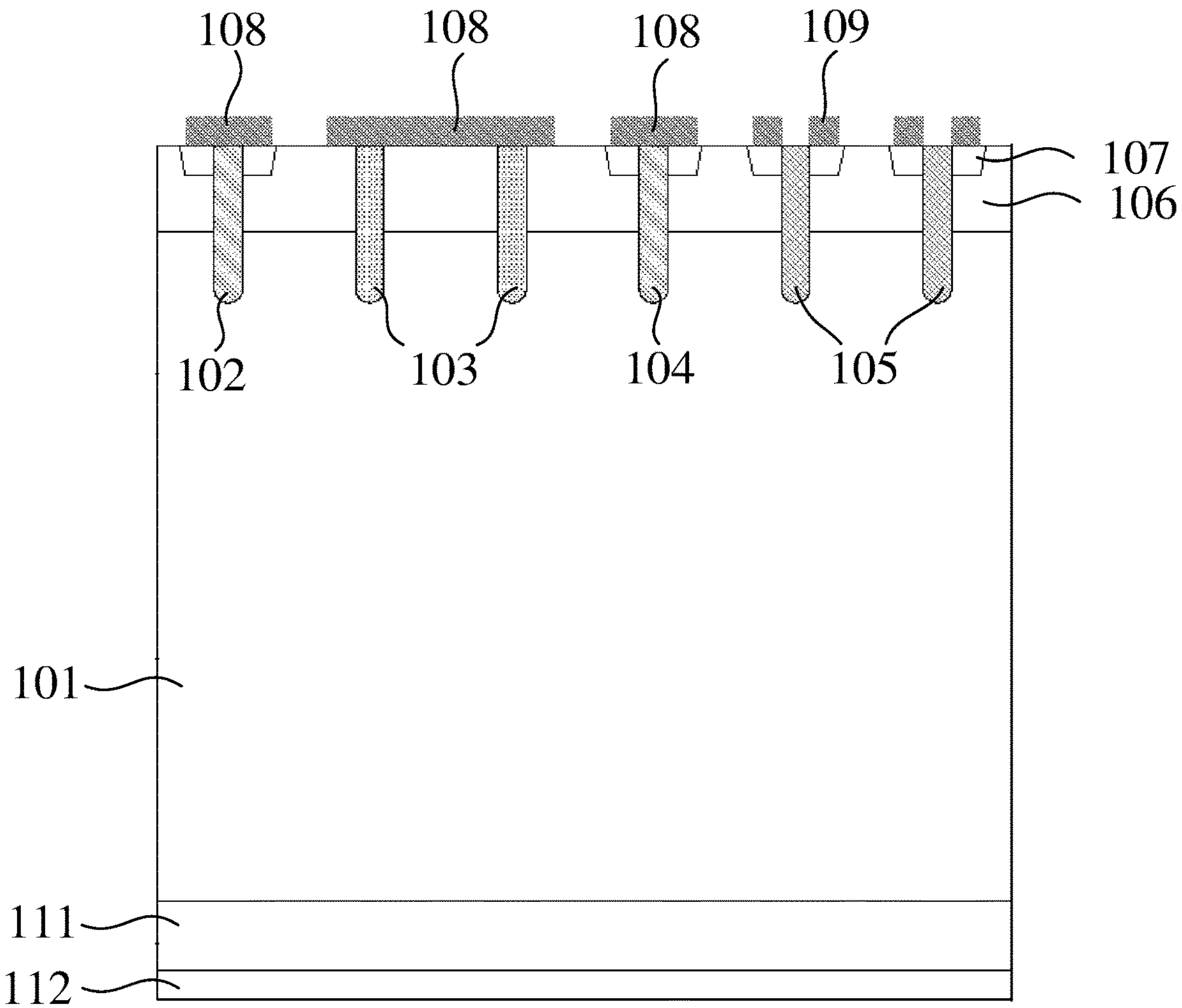
FIG. 9 is a schematic diagram of a cross-sectional structure of a third intermediate structure formed by a relevant step of a preparation method of a cell structure of a semiconductor device according to an exemplary embodiment of the present disclosure.

On a basis of the above embodiments, the present embodiment provides a preparation method of a cell structure of a semiconductor device. FIG. 6 is a schematic flowchart of a preparation method of a cell structure of a semiconductor device according to an exemplary embodiment of the present disclosure. FIG. 7 to FIG. 9 are schematic diagrams of cross-sectional structures formed by relevant steps of a preparation method of a cell structure of a semiconductor device according to embodiments of the present disclosure. With reference to FIG. 6 and FIGS. 7-9, detail steps of an exemplary method of the preparation method of the cell structure of a semiconductor device proposed in the embodiments of the present disclosure are described below.

As shown in FIG. 6, the preparation method of the cell structure of a semiconductor device of the embodiment includes following steps.

Step S110: providing a substrate 101 of a first conductive type.

The substrate 101 is an epitaxial silicon wafer or a silicon wafer grown by a zone melting method (i.e., FZ method), and the substrate 101 may be an epitaxially grown drift layer.

Step S120: forming at least one first trench gate 102, at least one second trench gate 103, at least one third trench gate 104 and at least one fourth trench gate 105 sequentially arranged side by side in an upper surface of the substrate 101.

The first trench gate 102, the second trench gate 103, the third trench gate 104, and the fourth trench gate 105 extend in a same direction.

The first trench gate 102 includes a first gate trench (not shown in figures) located in the upper surface of the substrate 101, a first gate (not shown in figures) disposed in the first gate trench, and a first gate insulating layer (not shown in figures) disposed between the first gate trench and the first gate. The first gate insulating layer isolates the first gate from the substrate 101.

The second trench gate 103 includes a second gate trench (not shown in figures) located in the upper surface of the substrate 101, a second gate (not shown in figures) disposed in the second gate trench, and a second gate insulating layer (not shown in figures) disposed between the second gate trench and the second gate. The second gate insulating layer isolates the second gate from the substrate 101.

The third trench gate 104 includes a third gate trench (not shown in figures) located in the upper surface of the substrate 101, a third gate (not shown in figures) disposed in the third gate trench, and a third gate insulating layer (not shown in figures) disposed between the third gate trench and the third gate. The third gate insulating layer isolates the third gate from the substrate 101.

The fourth trench gate 105 includes a fourth gate trench (not shown in figures) located in the upper surface of the substrate 101, a fourth gate (not shown in figures) disposed in the fourth gate trench, and a fourth gate insulating layer (not shown in figures) disposed between the fourth gate trench and the fourth gate, The fourth gate insulating layer isolates the fourth gate from the substrate 101.

A material of a gate of each trench gate includes polysilicon.

Step S130: forming a well region 106 of a second conductive type between any two adjacent trench gates in the upper surface of the substrate 101.

The well region 106 is a well region of a second conductive type, and the well region 106 is located between any two adjacent trench gates. A depth of any one of the first trench gate 102, the second trench gate 103, the third trench gate 104, and the fourth trench gate 105 is greater than a depth of the well region 106. An upper surface of the well region 106 is flush with the upper surface of the substrate 101. Each trench gate is in contact with the well regions 106 on two sides of the trench gate.

When the first conductive type is N-type and the second conductive type is P-type, the P-type well region 106 is formed by boron ion implantation, an injection energy is 100 KeV, and a doping junction depth of about 2.5 um is formed by a 1000-degree thermal process. The ion implantation of the P-type well region 106 is a full-surface ion implantation without a mask. Boron ions are injected into a gate of each trench gate, which has little effect on gate performance.

Step S140: as shown in FIG. 7, forming a source region 107 of the first conductive type in an upper surface of the well region 106 and on two sides of each of the first trench gate 102, the third trench gate 104, and the fourth trench gate 105. The first trench gate 102, the third trench gate 104 and the fourth trench gate 105 are respectively in contact with the source regions 107 on two sides of the first trench gate 102, the third trench gate 104, and the fourth trench gate 105.

The source region 107 is a source region of the first conductive type. The source region 107 is disposed in the surface of the well region 106, and is disposed on two sides of each of the first trench gate 102, the third trench gate 104, and the fourth trench gate 105. The first trench gate 102 is in contact with the source regions 107 on two sides of the first trench gate 102, the third trench gate 104 is in contact with the source regions 107 on two sides of the third trench gate 104, and the fourth trench gate 105 is in contact with the source regions 107 on two sides of the fourth trench gate 105. An upper surface of the source region 107 is flush with the upper surface of the well region 106.

When the first conductive type is N-type and the second conductive type is P-type, the N-type source region 107 is formed by phosphorus ion implantation, an injection energy is 90 Kev, and then a doping junction depth of 0.8 um is formed by a 950-degree thermal process. The ion implantation of the N-type source region 107 requires a mask.

Figure 10:
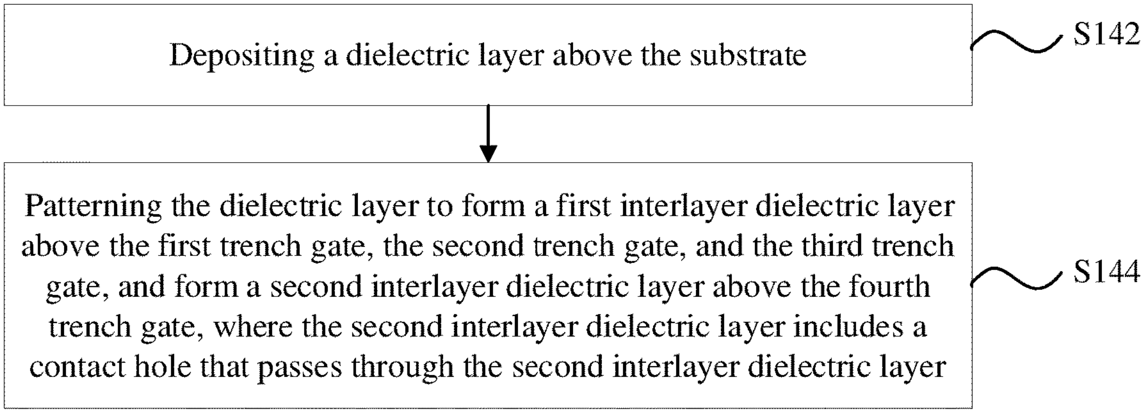
FIG. 10 is a schematic flowchart of a preparation method of a cell structure of a semiconductor device according to another exemplary embodiment of the present disclosure.

After step S140, as shown in FIG. 10, following steps are included:

S142: as shown in FIG. 8, depositing a dielectric layer 113 above the substrate 101;

S144: as shown in FIG. 9, patterning the dielectric layer 113 to form a first interlayer dielectric layer 108 above the first trench gate 102, the second trench gate 103, and the third trench gate 104, and form a second interlayer dielectric layer 109 above the fourth trench gate 105, where the second interlayer dielectric layer 109 includes a contact hole that passes through the second interlayer dielectric layer 109.

A material of the above dielectric layer includes a Boro-Phospho-Silicate Glass (BPSG), and a deposition thickness of the material is 1 um.

A patterning process of the dielectric layer is mainly a hole etching process, there are two kinds of hole etching processes, one is a hole opened above the source region 107, so that the source region 107 is connected to an emitter metal layer 110, and the second is a hole (i.e., the contact hole described above) opened above the fourth trench gate 105, so that the fourth trench gate 105 is electrically connected to the emitter metal layer 110 formed behind.

Step S150: forming an emitter metal layer 110 electrically connected to the source region 107 above the substrate 101, where the first trench gate 102, the second trench gate 103 and the third trench gate 104 are isolated from the emitter metal layer 110 by a first interlayer dielectric layer 108, and the fourth trench gate 105 is electrically connected to the emitter metal layer 110.

Specifically, the emitter metal layer 110 is electrically connected to the fourth trench gate 105 by a conductive material filled in the contact hole, and the conductive material may be the same as a material of the emitter metal layer 110.

The first trench gate 102, the second trench gate 103, and the third trench gate 104 are connected to an external gate driving circuit.

It should be seen that the first trench gate 102 and the third trench gate 104 are both connected to the external gate driving circuit, and are respectively in contact with the source regions 107 on both sides of the first trench gate 102 and the third trench gate 104, so that the first trench gate 102 and the third trench gate 104 are both true gates. After applying a voltage to the first trench gate 102, the third trench gate 104, and an emitter, an inversion channel is first formed in the well region 106, and then the source regions 107 on two sides of the first trench gate 102 and the third trench gate 104 may realize a path of electronics, in an inversion electron channel, from the emitter to a collector to form a conduction current.

Although the second trench gate 103 is connected to the external gate driving circuit, two sides of the second trench gate 103 are not provided with the source region 107, so that the second trench gate 103 is a virtual gate. After applying a voltage to the second trench gate 103 and the emitter, an inversion channel (carrier accumulation) is first formed in the well region 106, but due to the absence of the source region 107, an inversion electron channel is failed to be formed, and a conduction current is failed to be formed. However, after the second trench gate 103 and the emitter are applied with a voltage, presence of an inversion electron may attract a hole of the collector to move upward at a uniform velocity, which is conducive to hole current transport, so that Vcesat may be reduced, and a conduction loss may be reduced.

Although the fourth trench gate 105 is in contact with the source regions 107 on two sides of the fourth trench gate 105, the fourth trench gate 105 is electrically connected to the emitter metal layer 110, and is not connected to an external gate control circuit, so that gate control is failed to be realized. Neither is an inversion electron formed in the well region 106, nor is a path of electronics realized, and a conductive channel is failed to be formed, thus reducing a saturation current, and improving a short circuit time Tsc.

The true gate and the virtual grid are alternately disposed, the first trench gate 102 and the third trench gate 104 are separated by at least one second trench gate 103, and the second trench gate 103 and the fourth trench gate 105 are separated by at least one third trench gate 104.

Quantities of the first trench gate 102, the second trench gate 103, the third trench gate 104 and the fourth trench gate 105 are related to a size of the cell structure. The quantities of the first trench gate 102, the second trench gate 103, the third trench gate 104 and the fourth trench gate 105 are selected to achieve a compromise balance between the saturation current, the Vcesat, and the short-circuit tolerance.

Moreover, the true gates are separated by the virtual gates, which may avoid an excessive current density and improving an anti-dv/dt capability of the device.

For example, a quantity of the first trench gate 102 may be 1, a quantity of the second trench gate 103 may be 2, a quantity of the third trench gate 104 may be 1, and a quantity of the fourth trench gate 105 may be 2.

After the step S150, it is also necessary to deposit and etch a passivation layer on a front side, then perform a back thinning process, and then perform ion implantation, metallization and other processes.

Step S160: forming a field stop layer 111 of the first conductive type below the substrate 101.

The field stop layer 111 is a field stop layer of the first conductive type, and the field stop layer 111 is located below the substrate 101.

Step S170: forming a collector region 112 of the second conductive type below the field stop layer 111.

The collector region 112 is a collector region of the second conductive type, and the collector region 112 is located below the field stop layer 111.

Step S180: forming a collector metal layer electrically connected to the collector region 112 below the collector region 112.

In the present embodiments, the first conductive type and the second conductive type are opposite. For example, when the first conductive type is N-type, the second conductive type is P-type; and when the first conductive type is P-type, the second conductive type is N-type. Specifically, a reasonable selection may be made according to a type of a device actually required to be prepared.

It can be seen that a preparation process of the semiconductor device in the present disclosure is consistent with a preparation process of a traditional trench gate IGBT, without increasing a process complexity and without increasing cost.

In the present embodiments, a preparation method of a cell structure of a semiconductor device is provided, which includes: providing a substrate 101 of a first conductive type; forming at least one first trench gate 102, at least one second trench gate 103, at least one third trench gate 104, and at least one fourth trench gate 105 sequentially arranged side by side in an upper surface of the substrate 101; forming a well region 106 of a second conductive type between any two adjacent trench gates in the upper surface of the substrate 101; forming a source region 107 of the first conductive type in an upper surface of the well region 106 and on two sides of each of the first trench gate 102, the third trench gate 104, and the fourth trench gate 105, where the first trench gate 102, the third trench gate 104, and the fourth trench gate 105 are respectively in contact with the source regions 107 on two sides of the first trench gate 102, the third trench gate 104, and the fourth trench gate 105; and forming an emitter metal layer 110 electrically connected to the source region 107 above the substrate 101, where the first trench gate 102, the second trench gate 103 and the third trench gate 104 are isolated from the emitter metal layer 110 by a first interlayer dielectric layer 108, and the fourth trench gate 105 is electrically connected to the emitter metal layer 110. The cell structure prepared by the preparation method may achieve a better compromise balance between three parameters of a conduction voltage drop, a saturation current, and a short circuit time, and may also improve an anti-dv/dt capability of the device.

The above are merely preferred embodiments of the present disclosure and are not intended to limit the present disclosure, for those skilled in the art, the present disclosure may have various changes and variations. Any modification, equivalent substitution, improvement, etc. made in the spirit and principles of this disclosure shall be included in a protection scope of the present disclosure. Although the embodiments disclosed in the present disclosure are as above, the above contents are only embodiments adopted for convenience of understanding the present disclosure, and are not intended to limit the present disclosure. Any person skilled in the art to which the present disclosure belongs may, without departing from the spirit and scope disclosed in the present disclosure, make any modification or change in the form and details of the implementation, but the protection scope of the present disclosure shall still be subject to the scope defined by the appended claims.

What is claimed is:

1. A cell structure of a semiconductor device, comprising:

a substrate of a first conductive type;

at least one first trench gate, at least one second trench gate, at least one third trench gate, and at least one fourth trench gate that are sequentially disposed side by side in an upper surface of the substrate;

a well region of a second conductive type located in the upper surface of the substrate and disposed between any two adjacent trench gates;

a source region of the first conductive type located in an upper surface of the well region and disposed on two sides of each of the first trench gate, the third trench gate, and the fourth trench gate, wherein the first trench gate, the third trench gate, and the fourth trench gate are respectively in contact with source regions on two sides of the first trench gate, the third trench gate, and the fourth trench gate; and an emitter metal layer located above the substrate and electrically connected to the source region, wherein the first trench gate, the second trench gate, and the third trench gate are isolated from the emitter metal layer by a first interlayer dielectric layer, and the fourth trench gate is electrically connected to the emitter metal layer.

2. The cell structure of the semiconductor device according to claim 1, wherein the first trench gate, the second trench gate, and the third trench gate are connected to an external gate driving circuit.

3. The cell structure of the semiconductor device according to claim 1, wherein a depth of any one of the first trench gate, the second trench gate, the third trench gate, and the fourth trench gate is greater than a depth of the well region.

4. The cell structure of the semiconductor device according to claim 3, wherein a junction depth of the well region is 2.5 um.

5. The cell structure of the semiconductor device according to claim 1, further comprising: a second interlayer dielectric layer located above the fourth trench gate, wherein the second interlayer dielectric layer comprises a contact hole that passes through the second interlayer dielectric layer, and the emitter metal layer is electrically connected to the fourth trench gate by a conductive material filled in the contact hole.

6. The cell structure of the semiconductor device according to claim 1, wherein the first trench gate comprises a first gate trench located in the upper surface of the substrate, a first gate disposed in the first gate trench, and a first gate insulating layer disposed between the first gate trench and the first gate.

7. The cell structure of the semiconductor device according to claim 1, wherein the second trench gate comprises a second gate trench located in the upper surface of the substrate, a second gate disposed in the second gate trench, and a second gate insulating layer disposed between the second gate trench and the second gate.

8. The cell structure of the semiconductor device according to claim 1, wherein the third trench gate comprises a third gate trench located in the upper surface of the substrate, a third gate disposed in the third gate trench, and a third gate insulating layer disposed between the third gate trench and the third gate.

9. The cell structure of the semiconductor device according to claim 1, wherein the fourth trench gate comprises a fourth gate trench located in the upper surface of the substrate, a fourth gate disposed in the fourth gate trench, and a fourth gate insulating layer disposed between the fourth gate trench and the fourth gate.

10. The cell structure of the semiconductor device according to claim 1, further comprising:

a field stop layer of the first conductive type located below the substrate;

a collector region of the second conductive type located below the field stop layer; and a collector metal layer located below the collector region and electrically connected to the collector region.

11. The cell structure of the semiconductor device according to claim 1, wherein the first trench gate, the second trench gate, the third trench gate and the fourth trench gate extend in a same direction.

12. The cell structure of the semiconductor device according to claim 1, wherein a junction depth of the source region is smaller than a junction depth of the well region.

13. The cell structure of the semiconductor device according to claim 12, wherein the junction depth of the source region is 0.8 um.

14. The cell structure of the semiconductor device according to claim 1, wherein a material of the first interlayer dielectric layer is a Boro-Phospho-Silicate Glass.

15. The cell structure of the semiconductor device according to claim 14, wherein a thickness of the material of the first interlayer dielectric layer is 1 um.

16. The cell structure of the semiconductor device according to claim 1, wherein a quantity of the at least one first trench gate is 1, a quantity of the at least one second trench gate is 2, a quantity of the at least one third trench gate is 1, and a quantity of the at least one fourth trench gate is 2.

17. A semiconductor device, comprising one or more of cell structures, wherein each of the one or more of cell structures comprises:

a substrate of a first conductive type;

at least one first trench gate, at least one second trench gate, at least one third trench gate, and at least one fourth trench gate that are sequentially disposed side by side in an upper surface of the substrate;

a well region of a second conductive type located in the upper surface of the substrate and disposed between any two adjacent trench gates;

a source region of the first conductive type located in an upper surface of the well region and disposed on two sides of each of the first trench gate, the third trench gate, and the fourth trench gate, wherein the first trench gate, the third trench gate, and the fourth trench gate are respectively in contact with source regions on two sides of the first trench gate, the third trench gate, and the fourth trench gate; and an emitter metal layer located above the substrate and electrically connected to the source region, wherein the first trench gate, the second trench gate, and the third trench gate are isolated from the emitter metal layer by a first interlayer dielectric layer, and the fourth trench gate is electrically connected to the emitter metal layer.

18. A preparation method of a cell structure of a semiconductor device, comprising:

forming at least one first trench gate, at least one second trench gate, at least one third trench gate and at least one fourth trench gate sequentially arranged side by side in an upper surface of a substrate of a first conductive type;

forming a well region of a second conductive type between any two adjacent trench gates in the upper surface of the substrate;

forming a source region of the first conductive type in an upper surface of the well region and on two sides of each of the first trench gate, the third trench gate, and the fourth trench gate, wherein the first trench gate, the third trench gate and the fourth trench gate are respectively in contact with source regions on two sides of the first trench gate, the third trench gate, and the fourth trench gate; and forming an emitter metal layer electrically connected to the source region above the substrate, wherein the first trench gate, the second trench gate and the third trench gate are isolated from the emitter metal layer by a first interlayer dielectric layer, and the fourth trench gate is electrically connected to the emitter metal layer.

19. The preparation method of the cell structure of the semiconductor device according to claim 18, further comprising:

forming a field stop layer of the first conductive type below the substrate;

forming a collector region of the second conductive type below the field stop layer; and forming a collector metal layer electrically connected to the collector region below the collector region.

20. The preparation method of the cell structure of the semiconductor device according to claim 18, wherein after the forming a source region of the first conductive type in an upper surface of the well region and on two sides of each of the first trench gate, the third trench gate, and the fourth trench gate, the preparation method further comprises:

depositing a dielectric layer above the substrate; and patterning the dielectric layer to form the first interlayer dielectric layer above the first trench gate, the second trench gate, and the third trench gate, and form a second interlayer dielectric layer above the fourth trench gate, wherein the second interlayer dielectric layer comprises a contact hole that passes through the second interlayer dielectric layer.

* * * * *